US012610463B2

(12) United States Patent
Ishikawa et al.

(10) Patent No.: US 12,610,463 B2
(45) Date of Patent: Apr. 21, 2026

(54) COPPER BASE SUBSTRATE COMPRISING AN INSULATING LAYER HAVING A SPECIFIC RELATIONSHIP BETWEEN THICKNESS AND ELASTIC MODULUS

(71) Applicant: MITSUBISHI MATERIALS CORPORATION, Tokyo (JP)

(72) Inventors: Fumiaki Ishikawa, Saitama (JP); Shintaro Hara, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 374 days.

(21) Appl. No.: 17/913,516

(22) PCT Filed: Mar. 29, 2021

(86) PCT No.: PCT/JP2021/013212
§ 371 (c)(1),
(2) Date: Sep. 22, 2022

(87) PCT Pub. No.: WO2021/200792
PCT Pub. Date: Oct. 7, 2021

(65) Prior Publication Data
US 2023/0105989 A1 Apr. 6, 2023

(30) Foreign Application Priority Data

Mar. 31, 2020 (JP) ................................. 2020-065163

(51) Int. Cl.
*H05K 1/05* (2006.01)
*B32B 15/01* (2006.01)
(Continued)

(52) U.S. Cl.
CPC ............. *H05K 1/056* (2013.01); *B32B 15/01* (2013.01); *H01L 23/3735* (2013.01);
(Continued)

(58) Field of Classification Search
CPC . H01L 23/142; H01L 23/145; H01L 23/3735; H01L 23/3737; H05K 1/056;
(Continued)

(56) References Cited

U.S. PATENT DOCUMENTS 12,127,342 B2 * 10/2024 Ishikawa ........... H01L 23/49866
2011/0205721 A1 * 8/2011 Endo ........................ C08K 3/34
428/416
(Continued)

FOREIGN PATENT DOCUMENTS

CN 1714608 A 12/2005
CN 103283313 A 9/2013
(Continued)

OTHER PUBLICATIONS

Translation of JP 2020072198 A (Year: 2020).*
(Continued)

*Primary Examiner* — Hoa (Holly) Le
(74) *Attorney, Agent, or Firm* — Troutman Pepper Locke LLP; James E. Armstrong, IV

(57) ABSTRACT

A copper base substrate of the present invention, in which a copper substrate, an insulating layer, and a circuit layer, are laminated in an order in the copper substrate, a ratio of a thickness (unit: μm) to an elastic modulus (unit: GPa) at 100° C. is 50 or more in the insulating layer, and the circuit layer has an elastic modulus at 100° C. of 100 GPa or less.

4 Claims, 1 Drawing Sheet

(51) Int. Cl.

| | |
|---|---|
| *H01L 23/373* | (2006.01) |
| *H05K 1/02* | (2006.01) |
| *H01L 23/00* | (2006.01) |
| *H05K 1/181* | (2026.01) |

(52) U.S. Cl.
CPC ............ *H05K 1/0271* (2013.01); *H01L 24/16* (2013.01); *H01L 2224/16227* (2013.01); *H05K 1/181* (2013.01); *H05K 2201/0154* (2013.01); *H05K 2201/0191* (2013.01); *H05K 2201/0209* (2013.01); *H05K 2201/10015* (2013.01); *H05K 2201/10022* (2013.01); *H05K 2201/10075* (2013.01); *H05K 2201/10121* (2013.01); *H05K 2201/10166* (2013.01)

(58) Field of Classification Search
CPC ........... H05K 1/181; H05K 2201/0154; H05K 2201/0191; H05K 2201/0209
See application file for complete search history.

(56) References Cited

U.S. PATENT DOCUMENTS

| | | | | |
|---|---|---|---|---|
| 2012/0285732 A1* | 11/2012 | Takeuchi | ............. | H05K 3/4691 174/250 |
| 2012/0325531 A1* | 12/2012 | Okouchi | ............. | H05K 3/4602 174/257 |
| 2021/0129489 A1* | 5/2021 | Sawaguchi | ......... | H01L 23/3736 |
| 2023/0128897 A1* | 4/2023 | Harisaki | ............. | H05K 1/0326 428/418 |

FOREIGN PATENT DOCUMENTS

| | | | | | |
|---|---|---|---|---|---|
| EP | 3671827 | A1 | | 6/2020 | |
| JP | H11-087866 | A | | 3/1999 | |
| JP | 2014222788 | A | * | 11/2014 | ........... C04B 37/026 |
| JP | 2016-111171 | A | | 6/2016 | |
| JP | 6418348 | B1 | * | 11/2018 | ............. B32B 27/40 |
| JP | 2020-013874 | A | | 1/2020 | |
| JP | 2020045549 | A | * | 3/2020 | |
| JP | 2020072198 | A | * | 5/2020 | ............. B32B 15/08 |
| WO | 2017/086474 | A1 | | 5/2017 | |

OTHER PUBLICATIONS

Translation of JP-6418348-B1 (Year: 2013).*
Khatibi et al., Temperature Dependent Elastic and Thermal Properties of Thin Copper Foils (Year: 2007).*
Translation of JP 2014222788 A (Year: 2014).*
Translation of JP 2020045549 (Year: 2020).*
International Search Report mailed Jun. 15, 2021, issued for PCT/JP2021/013212 and English translation thereof.
Office Action issued in Chinese Patent Application No. CN 202180025042.9, mailed Apr. 26, 2025.
Office Action issued in Chinese Patent Application No. CN 202180025042.9, mailed Aug. 2, 2025, with English translation.

* cited by examiner

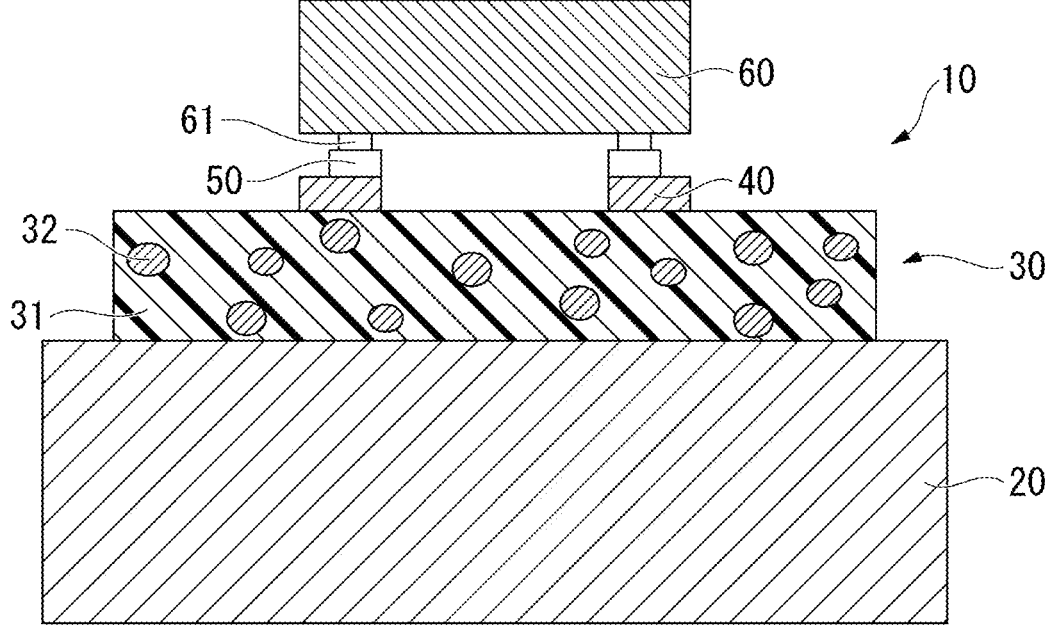

COPPER BASE SUBSTRATE COMPRISING AN INSULATING LAYER HAVING A SPECIFIC RELATIONSHIP BETWEEN THICKNESS AND ELASTIC MODULUS

TECHNICAL FIELD

The present invention relates to a copper base substrate. Priority is claimed on Japanese Patent Application No. 2020-065163, filed Mar. 31, 2020, the content of which is incorporated herein by reference.

BACKGROUND ART

As one of the substrates for mounting electronic components such as semiconductor elements or LEDs, metal base substrates are known. A metal base substrate is a laminate in which a metal substrate, an insulating layer, and a circuit layer are laminated in this order. The insulating layer is generally formed of an insulating composition containing a resin having excellent insulating properties or withstand voltage and an inorganic filler having excellent thermal conductivity. An electronic component is mounted on the circuit layer via solder. In the metal base substrate configured as described above, heat generated from the electronic component is transferred to the metal substrate via the insulating layer and dissipated from the metal substrate to the outside.

In the metal base substrate, when the difference in thermal expansion coefficient between the metal base substrate and the electronic component bonded to the metal base substrate via solder is large, there are cases where stress that is applied to the solder bonding the electronic component and the circuit layer of the metal base substrate increases due to the thermal cycles depending on the electronic component being turned on and off or external environments and solder cracks may be initiated. Therefore, it has been studied to alleviate the difference in thermal expansion coefficient between the metal substrate of the metal base substrate and the electronic component with the insulating layer by decreasing the elastic modulus of the insulating layer of the metal base substrate (Patent Documents 1 and 2).

CITATION LIST

Patent Documents

[Patent Document 1]
  Japanese Unexamined Patent Application, First Publication No. H11-87866
[Patent Document 2]
  Japanese Unexamined Patent Application, First Publication No. 2016-111171

SUMMARY OF INVENTION

Technical Problem

For suppressing the initiation of solder cracks due to the thermal cycles at the time of mounting electronic components and improving reliability against the thermal cycles, it is effective to alleviate thermal stress caused by the expansion of the metal base by decreasing the elastic modulus of the insulating layer of the metal base substrate to make the insulating layer easily deform. However, since stress caused by the expansion of the circuit layer is also present in the solder, there are limitations on improvement in the reliability against the thermal cycles only by decreasing the elastic modulus of the insulating layer of the metal base substrate.

The present invention has been made in view of the above-described circumstances, and an objective of the present invention is to provide a metal base substrate having excellent reliability against a thermal cycles at the time of mounting an electronic component.

Solution to Problem

In order to solve the above-described problem, a metal base substrate of the present invention, in which a copper substrate, an insulating layer, and a circuit layer are laminated in an order in the copper substrate, a ratio of a thickness (unit: μm) to an elastic modulus (unit: GPa) at 100° C. is 50 or more in the insulating layer, and the circuit layer has an elastic modulus at 100° C. of 100 GPa or less.

According to the copper base substrate of the present invention, since the insulating layer has a large ratio of the thickness (unit: μm) to the elastic modulus at 100° C. (unit: GPa) of 50 or more, the insulating layer becomes easily deformable, and the difference in thermal expansion coefficient between the metal substrate and an electronic component due to a thermal cycles can be alleviated with the insulating layer. In addition, since the circuit layer has a low elastic modulus at 100° C. of 100 GPa or less, the difference in thermal expansion coefficient between the circuit layer and the electronic component due to the thermal cycles can be reduced. These make it possible to reduce stress that is applied to solder bonding the electronic component and the circuit layer of the copper base substrate due to the thermal cycles. Therefore, the copper base substrate of the present invention improves in reliability against a thermal cycles at the time of mounting electronic components.

Here, in the copper base substrate of the present invention, the insulating layer may contain a polyimide resin, a polyamide-imide resin, or a resin that is a mixture thereof.

In this case, since the insulating layer contains these resins, the insulating property, withstand voltage, chemical resistance, and mechanical characteristics of the copper base substrate improve.

In addition, in the copper base substrate of the present invention, the insulating layer may contain an inorganic filler, and the inorganic filler may have an average particle size in a range of 0.1 μm or more and 20 μm or less.

In this case, since the insulating layer contains the above-described inorganic filler, the thermal conductivity and withstand voltage of the copper base substrate improve.

In addition, in the copper base substrate of the present invention, the circuit layer may be made of a copper foil, a copper alloy foil, an aluminum foil, or an aluminum alloy foil.

In this case, the circuit layer is made of a copper foil, a copper alloy foil, an aluminum foil, or an aluminum alloy foil and thus has a high electrical conductivity, which makes it possible to thin the circuit layer.

Advantageous Effects of Invention

According to the present invention, it becomes possible to provide a copper base substrate having excellent reliability against a thermal cycles at the time of mounting electronic components.

BRIEF DESCRIPTION OF DRAWINGS

FIG. 1 is a schematic cross-sectional view of a copper base substrate according to an embodiment of the present invention.

DESCRIPTION OF EMBODIMENTS

Hereinafter, an embodiment of the present invention will be described with reference to the accompanying drawings.

FIG. 1 is a schematic cross-sectional view of a copper base substrate according to an embodiment of the present invention.

In FIG. 1, a copper base substrate 10 is a laminate in which a copper substrate 20, an insulating layer 30, and circuit layers 40 are laminated in this order. Terminals 61 of an electronic component 60 are mounted on the circuit layers 40 of the copper base substrate 10 via solder 50.

The copper substrate 20 is a member that serves as a base of the copper base substrate 10. The copper substrate 20 is made of copper or a copper alloy.

The insulating layer 30 is a layer for insulating the copper substrate 20 and the circuit layers 40. The insulating layer 30 is formed of an insulating resin composition containing an insulating resin 31 and an inorganic filler 32. When the insulating layer 30 is formed of the insulating resin composition containing the insulating resin 31 having high insulating properties and the inorganic filler 32 having a high thermal conductivity, it is possible to further reduce the thermal resistance of the entire copper base substrate 10 from the circuit layers 40 through the copper substrate 20 while maintaining the insulating properties.

The insulating resin 31 preferably contains a polyimide resin, a polyamide-imide resin, or a mixture thereof. Since these resins are excellent in terms of characteristics such as insulating properties, withstand voltage, chemical resistance, and mechanical characteristics, these characteristics of the copper base substrate 10 improve.

The inorganic filler 32 preferably has an average particle size in a range of 0.1 µm or more and 20 µm or less. When the average particle size of the inorganic filler 32 is 0.1 µm or more, the thermal conductivity of the insulating layer 30 improves. When the average particle size of the inorganic filler 32 is 20 µm or less, the withstand voltage of the insulating layer 30 improves. In addition, when the average particle size of the inorganic filler 32 is in the above-described range, it is difficult for the inorganic filler 32 to form agglomerated particles, and it becomes easy to uniformly disperse the inorganic filler 32 in the insulating resin 31. When the inorganic filler 32 does not form any agglomerated particles and is dispersed in the insulating resin 31 as primary particles or fine particles that are nearly primary particles, the withstand voltage of the insulating layer 30 improves. From the viewpoint of improving the thermal conductivity of the insulating layer 30, the average particle size of the inorganic filler 32 is preferably in a range of 0.3 µm or more and 20 µm or less.

The content of the inorganic filler 32 in the insulating layer 30 is preferably in a range of 50% by volume or more and 85% by volume or less. When the content of the inorganic filler 32 is 50% by volume or more, the thermal conductivity of the insulating layer 30 improves. On the other hand, when the content of the inorganic filler 32 is 85% by volume or less, the withstand voltage of the insulating layer 30 improves. In addition, when the content of the inorganic filler 32 is in the above-described range, it becomes easy for the inorganic filler 32 to be uniformly dispersed in the insulating resin 31. When the inorganic filler 32 is uniformly dispersed in the insulating resin 31, the mechanical strength of the insulating layer 30 improves. From the viewpoint of improving the thermal conductivity of the insulating layer 30, the content of the inorganic filler 32 is particularly preferably in a range of 50% by volume or more and 80% by volume or less.

As the inorganic filler 32, alumina ($Al_2O_3$) particles, alumina hydrate particles, aluminum nitride (AlN) particles, silica ($SiO_2$) particles, silicon carbide (SiC) particles, titanium oxide ($TiO_2$) particles, boron nitride (BN) particles, and the like can be used. Among these fillers, alumina particles are preferable. The alumina particles are more preferably α-alumina particles. The α-alumina particles preferably have a ratio of the tapped density to the true density (tapped density/true density) of 0.1 or more. The tapped density/true density correlates with the packing density of the α-alumina particles in the insulating layer 30, and, when the tapped density/true density is high, the packing density of the α-alumina particles in the insulating layer 30 can be increased. When the packing density of the α-alumina particles in the insulating layer 30 becomes high, the intervals between the α-alumina particles in the insulating layer 30 become narrow, and voids (pores) are less likely to be generated in the insulating layer 30. The tapped density/true density is preferably in a range of 0.2 or more and 0.9 or less. In addition, the α-alumina may be polycrystalline particles, but is particularly preferably single crystal particles.

In the insulating layer 30, the ratio (thickness/elastic modulus) of the thickness (unit: µm) to the elastic modulus at 100° C. (unit: GPa) is set to 50 or more. Since the thickness/elastic modulus of the insulating layer 30 is as high as 50 or more, the insulating layer 30 is easily deformable and has a high cushioning property in the thickness direction. Therefore, the insulating layer 30 has a high action of alleviating the difference in thermal expansion coefficient between the copper substrate 20 and the circuit layer 40 due to a thermal cycles. The thickness/elastic modulus of the insulating layer 30 is preferably in a range of 50 or more and 20000 or less, more preferably in a range of 50 or more and 2000 or less, and still more preferably in a range of 50 or more and 200 or less. The elastic modulus at 100° C. of the insulating layer 30 is preferably in a range of 0.01 GPa or more and 1 GPa or less and more preferably in a range of 0.01 GPa or more and 0.1 GPa or less. In addition, the thickness of the insulating layer 30 is preferably in a range of 10 µm or more and 200 µm or less and more preferably in a range of 50 µm or more and 200 µm or less.

The circuit layers 40 are formed in a circuit pattern. The terminals 61 of the electronic component 60 are bonded onto the circuit layers 40 formed in the circuit pattern via the solder 50 or the like. As a material of the circuit layer 40, a metal such as copper, a copper alloy, aluminum, an aluminum alloy, or gold can be used. The circuit layer 40 is preferably made of a copper foil, a copper alloy foil, an aluminum foil, or an aluminum alloy foil.

Since the elastic modulus at 100° C. of the circuit layer 40 is set to 100 GPa or less, stress that is applied to the solder caused by the difference in thermal expansion coefficient between the circuit layer 40 and the electronic component 60 due to a thermal cycles becomes small. The elastic modulus at 100° C. of the circuit layer 40 is preferably in a range of 50 GPa or more and 100 GPa or less. In addition, the thickness of the circuit layer 40 is preferably in a range of 20 µm or more and 200 µm or less.

The thicknesses of the copper substrate 20, the insulating layer 30, and the circuit layer 40 of the copper base substrate 10 can be measured, for example, in the following manner. The copper base substrate 10 is embedded in a resin, and a cross section is exposed by mechanical polishing. Next, the exposed cross section of the copper base substrate is observed using an optical microscope, and the thicknesses of the copper substrate 20, the insulating layer 30, and the circuit layer 40 are measured.

The elastic modulus of the copper substrate 20, the insulating layer 30, and the circuit layer 40 of the copper base substrate 10 are values measured at 100° C.

The elastic modulus (tensile elastic modulus) of the copper substrate 20 and the circuit layer 40 of the copper base substrate 10 can be measured, for example, in the following manner. The insulating layer 30 of the copper base substrate 10 is removed with a solvent to separate the copper substrate 20 and the circuit layer 40. The elastic modulus of the obtained copper substrate 20 and circuit layer 40 are measured by dynamic viscoelasticity measurement. The elastic modulus of the insulating layer 30 of the copper base substrate 10 can be measured, for example, in the following manner. The copper substrate 20 and the circuit layers 40 of the copper base substrate 10 are removed by etching, and the insulating layer 30 is isolated. The elastic modulus of the obtained insulating layer 30 is measured by dynamic viscoelasticity measurement.

Examples of the electronic component 60 that is mounted on the copper base substrate 10 of the present embodiment are not particularly limited and include a semiconductor element, a resistor, a capacitor, a crystal oscillator, and the like. Examples of the semiconductor element include MOSFET (metal-oxide-semiconductor field effect transistor), IGBT (insulated gate bipolar transistor), LSI (large scale integration), LED (light emitting diode), an LED chip, and LED-CSP (LED-chip size package).

Hereinafter, a method for manufacturing the copper base substrate 10 of the present embodiment will be described.

The copper base substrate 10 according to the present embodiment can be manufactured by, for example, a method including an insulating layer forming step and a circuit layer pressure-bonding step.

In the insulating layer forming step, the insulating layer 30 is formed on the copper substrate 20 to obtain a copper substrate with an insulating layer. The thickness (unit: μm) of the insulating layer 30 is set to a thickness at which the thickness/elastic modulus becomes 50 or more when the insulating layer 30 for elastic modulus measurement is formed on the copper substrate 20 and the elastic modulus of the obtained insulating layer 30 is measured. As a method for forming the insulating layer 30, a coating method or an electrodeposition method can be used.

The coating method is a method in which a coating liquid containing a solvent, an insulating resin, and an inorganic filler is applied onto the copper substrate 20 to form a coating layer, and then the coating layer is heated to obtain the insulating layer 30. As the coating liquid, an inorganic filler-dispersed resin material solution containing a resin material solution in which an insulating resin is dissolved and an inorganic filler dispersed in the resin material solution can be used. As a method for applying the coating liquid to the surface of the substrate, a spin coating method, a bar coating method, a knife coating method, a roll coating method, a blade coating method, a die coating method, a gravure coating method, a dip coating method, or the like can be used.

The electrodeposition method is a method in which the copper substrate 20 is immersed in an electrodeposition dispersion containing insulating resin particles and an inorganic filler, the insulating resin particles and the inorganic filler are electrodeposited on the surface of the substrate to form an electrodeposited film, and then the obtained electrodeposited film is heated to form the insulating layer 30. As the electrodeposition dispersion, an electrodeposition dispersion prepared by adding a poor solvent of an insulating resin material to an inorganic filler-dispersed insulating resin solution containing an insulating resin solution and an inorganic filler dispersed in the insulating resin solution and precipitating the insulating resin as particles can be used.

In the circuit layer pressure-bonding step, a metal foil is laminated on the insulating layer 30 of the copper substrate with the insulating layer, and the obtained laminate is heated and pressurized to form the circuit layers 40, thereby obtaining the copper base substrate 10. The heating temperature of the laminate is, for example, 200° C. or higher and more preferably 250° C. or higher. The upper limit of the heating temperature is lower than the thermal decomposition temperature of the insulating resin and preferably equal to or lower than a temperature that is lower than the thermal decomposition temperature by 30° C. The pressure that is applied during the pressure-bonding is, for example, in a range of 1 MPa or more and 30 MPa or less and more preferably in a range of 3 MPa or more and 25 MPa or less. The pressure-bonding time varies depending on the heating temperature or the pressure, but is generally 10 minutes or longer and 180 minutes or shorter.

According to the copper base substrate 10 of the present embodiment configured as described above, since the insulating layer 30 has a large ratio of the thickness (unit: μm) to the elastic modulus at 100° C. (unit: GPa) of 50 or more, the insulating layer 30 becomes easily deformable, and the difference in thermal expansion coefficient between the copper substrate 20 and the circuit layer 40 due to a thermal cycles can be alleviated with the insulating layer 30. In addition, since the circuit layer 40 has a low elastic modulus at 100° C. of 100 GPa or less, the difference in thermal expansion coefficient between the circuit layer 40 and the electronic component 60 due to the thermal cycles can be reduced. These make it possible to reduce stress that is applied to the solder 50 bonding the electronic component 60 and the circuit layer 40 of the copper base substrate 10 due to the thermal cycles. Therefore, the copper base substrate 10 of the present embodiment improves in reliability against a thermal cycles at the time of mounting the electronic component 60.

In addition, in the copper base substrate 10 of the present embodiment, in a case where the insulating layer 30 contains a polyimide resin, a polyamide-imide resin, or a mixture thereof, the insulating property, withstand voltage, chemical resistance, and mechanical characteristics of the copper base substrate 10 improve. Furthermore, in a case where the insulating layer 30 contains the inorganic filler 32, and the inorganic filler 32 has an average particle size in a range of 0.1 μm or more and 20 μm or less, the thermal conductivity and withstand voltage of the copper base substrate 10 improve. Still furthermore, in a case where the circuit layer 40 is made of a copper foil, a copper alloy foil, an aluminum foil, or an aluminum alloy foil, since the electrical conductivity is high, it is possible to thin the thickness of the circuit layer 40.

Hitherto, the embodiment of the present invention has been described, but the present invention is not limited thereto and can be appropriately modified within the scope of the technical concept of the invention.

EXAMPLES

Present Invention Example 1

A solvent-soluble polyimide solution and an α-alumina powder (crystal structure: single crystal, average particle size: 0.7 μm) were mixed such that the content rate of a polyimide and the α-alumina powder in a solid matter (insulating layer) that was generated by heating became 65% by volume. A solvent was added to the obtained mixture to dilute the mixture such that the concentration of the polyimide became 5% by mass. Subsequently, the obtained diluted mixture was dispersed by repeating a high-pressure injection treatment at a pressure of 50 MPa 10 times using Star Burst manufactured by Sugino Machine Limited to prepare a coating liquid for forming an insulating layer.

A copper substrate (composition: C1100, tough pitch copper) that was 1000 μm in thickness, 30 mm in length, and 20 mm in width was prepared. The coating liquid for forming an insulating layer was applied to the surface of this copper substrate by a bar coating method to form a coating layer. Next, the copper substrate on which the coating layer was formed was disposed on a hot plate, the temperature was raised from room temperature up to 60° C. at 3° C./min, the copper substrate was heated at 60° C. for 100 minutes, then, the temperature was further raised up to 120° C. at 1° C./min, and the copper substrate was heated at 120° C. for 100 minutes to dry the coating layer. Next, the copper substrate was heated at 250° C. for 1 minute and then heated at 400° C. for 1 minute. A copper substrate with an insulating layer having the insulating layer made of the polyimide resin in which α-alumina single crystal particles were dispersed and formed on the surface was produced in the above-pressure of 5 MPa using a carbon jig to pressure-bond the insulating layer and the copper foil. A copper base substrate in which the copper substrate, the insulating layer, and the copper foil were laminated in this order was produced in the above-described manner.

Present Invention Examples 2 to 4 and Comparative Examples 1 and 2

Copper base substrates were produced in the same manner as in Present Invention Example 1 except that the thickness and elastic modulus of the insulating layer and the elastic modulus of the circuit layer were each changed to values shown in Table 1 below.

[Evaluation]

For the copper base substrates obtained in Present Invention Examples 1 to 4 and Comparative Examples 1 and 2, the reliability against a thermal cycles was evaluated by the following method. The results are shown in Table 1.

(Reliability of Copper Base Substrate Against Thermal Cycles)

Sn—Ag—Cu solder was applied onto the circuit layer of the copper base substrate to form a solder layer having a length of 2.5 cm, a width of 2.5 cm, and a thickness of 100 μm, and a 2.5 cm×2.5 cm Si chip was mounted on the solder layer, thereby producing a test body. 3000 cycles of a thermal cycles in which 1 cycle was made up of −40° C. for 30 minutes and 150° C. for 30 minutes were applied to the produced test body. The test body after the application of the thermal cycles was embedded in a resin, a cross section was observed using a sample from which the cross section was exposed by polishing, and the reliability against a thermal cycles was evaluated as "O" when no crack having a length of 5 mm or more was initiated in the solder layer and evaluated as "X" when a crack having a length of 5 mm or more was initiated.

TABLE 1

| | Copper substrate | | Insulating layer | | | Circuit layer | | |
| --- | --- | --- | --- | --- | --- | --- | --- | --- |
| | Thickness (μm) | Elastic modulus at 100° C. (GPa) | Thickness (μm) | Elastic modulus at 100° C. (GPa) | Thickness/ Elastic modulus | Thickness (μm) | Elastic modulus at 100° C. (GPa) | Reliability against thermal cycles |
| Present Invention Example 1 | 1600 | 117 | 30 | 0.27 | 110 | 70 | 75 | O |
| Present Invention Example 2 | 1600 | 117 | 30 | 0.27 | 110 | 70 | 100 | O |
| Present Invention Example 3 | 1600 | 117 | 110 | 2.0 | 55 | 70 | 75 | O |
| Present Invention Example 4 | 1600 | 117 | 110 | 2.0 | 55 | 70 | 100 | O |
| Comparative Example 1 | 1600 | 117 | 110 | 2.0 | 55 | 70 | 125 | X |
| Comparative Example 2 | 1600 | 117 | 110 | 4.0 | 28 | 70 | 75 | X | described manner. The thickness of the insulating layer was set to 30 μm, the elastic modulus at 100° C. was set to 0.27 GPa, and the thickness/elastic modulus was set to 110.

A copper foil having a thickness of 70 μm (elastic modulus at 100° C.: 75 GPa, GHY5-HA-V2 manufactured by JX Nippon Mining & Metals Corporation) was overlaid and laminated on the insulating layer of the obtained copper substrate with an insulating layer. Next, the obtained laminate was heated in vacuum at a pressure-bonding temperature of 300° C. for 120 minutes under application of a In the copper base substrates of Present Invention Examples 1 to 4 in which the ratio (thickness/elastic modulus) of the thickness (unit: μm) to the elastic modulus (unit: GPa) of the insulating layer and the elastic modulus of the circuit layer were in the ranges of the present invention, it was confirmed that the reliability against a thermal cycles was excellent. This is because the thickness/elastic modulus of the insulating layer in the range of the present invention makes the difference in thermal expansion coefficient between the copper substrate and the electronic component due to the thermal cycles alleviated with the insulating layer. In addition, this is because the elastic modulus of the circuit layer in the range of the present invention decreases thermal stress that is applied to solder due to the difference in thermal expansion coefficient between the circuit layer and the electronic component.

In contrast, in the copper base substrate of Comparative Example 1 in which the thickness/elastic modulus of the insulating layer was in the range of the present invention, but the elastic modulus of the circuit layer exceeded the range of the present invention, the reliability against a thermal cycles deteriorated. This is because the elastic modulus of the circuit layer above the range of the present invention increased thermal stress that is applied to solder due to the difference in thermal expansion coefficient between the circuit layer and the electronic component.

In addition, in the copper base substrate of Comparative Example 2 in which the elastic modulus of the circuit layer was in the range of the present invention, but the thickness/elastic modulus of the insulating layer was below the range of the present invention, the reliability against a thermal cycles deteriorated. This is because the thickness/elastic modulus of the insulating layer was below the range of the present invention, and thus thermal stress that was applied to the solder due to the difference in thermal expansion coefficient between the copper substrate and the circuit layer due to the thermal cycles was not sufficiently alleviated.

REFERENCE SIGNS LIST

10 Copper base substrate
20 Copper substrate
30 Insulating layer
31 Insulating resin 32 Inorganic filler
40 Circuit layer
50 Solder
60 Electronic component
61 Terminal

What is claimed is:

1. A copper base substrate,
wherein a copper substrate, an insulating layer, and a circuit layer are laminated in an order in the copper base substrate,
a ratio of a thickness (unit: μm) to an elastic modulus (unit: GPa) at 100° C. is 50 or more in the insulating layer,
the circuit layer contains copper and has an elastic modulus at 100° C. of 100 GPa or less,
the elastic modulus at 100° C. of the circuit layer is measured by dynamic viscoelasticity measurement,
the circuit layer is thinner than the copper substrate, and
the elastic modulus of the circuit layer is lower than the elastic modulus of the copper substrate.

2. The copper base substrate according to claim 1,
wherein the insulating layer contains a polyimide resin, a polyamide-imide resin, or a resin that is a mixture thereof.

3. The copper base substrate according to claim 1,
wherein the insulating layer contains an inorganic filler, and
the inorganic filler has an average particle size in a range of 0.1 μm or more and 20 μm or less.

4. The copper base substrate according to claim 1,
wherein the circuit layer is made of a copper foil and a copper alloy foil.

* * * * *